(12) United States Patent
Matsuda et al.

(10) Patent No.: US 6,320,214 B1
(45) Date of Patent: Nov. 20, 2001

(54) SEMICONDUCTOR DEVICE HAVING A FERROELECTRIC TFT AND A DUMMY ELEMENT

(75) Inventors: Akihiro Matsuda, Colorado Springs, CO (US); Yoshihisa Nagano, Suita; Yasuhiro Uemoto, Otsu, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/209,214

(22) Filed: Dec. 11, 1998

(30) Foreign Application Priority Data

Dec. 24, 1997 (JP) .................................. 9-354430

(51) Int. Cl.[7] ................................ H01L 29/76
(52) U.S. Cl. ................ 257/295; 257/213; 257/296
(58) Field of Search .................. 257/296–310, 257/532, 213, 295

(56) References Cited

U.S. PATENT DOCUMENTS 5,689,126 * 11/1997 Takaishi ........................... 257/306
5,946,563 * 8/1999 Uehara et al. .................... 438/183
6,153,476 * 11/2000 Inaba et al. ...................... 438/275

* cited by examiner

Primary Examiner—Fetsum Abraham
(74) Attorney, Agent, or Firm—Merchant & Gould PC

(57) ABSTRACT

The present invention provides a semiconductor device including a semiconductor element and a dummy semiconductor element adjacent to the semiconductor element. When the semiconductor element is a capacitor element including a bottom electrode, a top electrode and a dielectric layer between the electrodes, a dummy capacitor element also has dummy electrodes and a dummy dielectric layer between the dummy electrodes. The dummy electrode is located so that a space between the top electrode of the capacitor element ad the dummy top electrode is in a predetermined range (e.g. 0.3 $\mu$m to 14 $\mu$m). The dummy capacitor element prevents the capacitor dielectric layer from degrading since the collision of the etching ions with the capacitor dielectric layer in a dry etching process is suppressed.

5 Claims, 21 Drawing Sheets

PRIOR ART

SEMICONDUCTOR DEVICE HAVING A FERROELECTRIC TFT AND A DUMMY ELEMENT

FIELD OF THE INVENTION

The present invention relates to a semiconductor device. More particularly the present invention relates to a semiconductor device including a semiconductor element such as a capacitor and a transistor in which a dielectric with high dielectric constant or a ferroelectric is used.

BACKGROUND OF THE INVENTION

With increases in the packing density of semiconductor memories, a capacitor element with larger capacity is needed. Therefore, a technology to integrate a capacitor element including a dielectric layer with high dielectric constant or a ferroelectric characteristics into a integrated circuit lately has attracted considerable attention.

In order to put a nonvolatile RAM into practice which enables writing and reading with lower operating voltage at higher speed compared to conventional devices, a technology to integrate a capacitor element including a ferroelectric layer has been pursued.

A conventional method for manufacturing a semiconductor device including a dielectric with high dielectric constant or a ferroelectric characteristics (hereinafter, a dielectric with high dielectric) is explained below referring to FIGS. 20A and 20B.

As shown in FIG. 20A, a first metal film 202 (e.g. a Pt film) is formed on a substrate 201 with an integrated circuit by sputtering. A dielectric film 203 with high dielectric constant is formed on the first metal film 202 by spin coating or chemical vapor deposition (CVD), followed by forming a second metal film 204 (e.g. a Pt film) on the dielectric film 203 by sputtering. After a photoresist 209 is formed on the second metal film 204 in a predetermined pattern, each film is selectively removed by dry etching to form a capacitor element 208 composed of first electrode 205, a capacitor dielectric layer 206 and a second electrode 207.

However, in such a capacitor element produced by the conventional method, a capacitor dielectric layer with high dielectric constant is degraded in electric characteristics. Such a degradation also is observed in a transistor including a dielectric layer with high dielectric constant.

SUMMARY OF THE INVENTION

Therefore, with the foregoing in mind, it is the object of the present invention to suppress a degradation of a dielectric with high dielectric constant in a semiconductor element.

In order to achieve the above-described object, an embodiment of the semiconductor device of the present invention comprises a substrate, a semiconductor element and a dummy semiconductor element. The semiconductor element includes a first dielectric layer on the substrate and an electrode on the first dielectric layer, and the dummy semiconductor element includes a second dielectric layer on the substrate and a dummy electrode on the second dielectric layer. The dummy semiconductor is located so that a space between the electrode and the dummy electrode is in a predetermined range. The predetermined range is preferably between 0.3 μm and 1.4 μm.

When the semiconductor element is a capacitor element, an embodiment of the semiconductor device of the present invention comprises a substrate, a capacitor element and a dummy capacitor element. The capacitor element includes a bottom electrode on the substrate, a first dielectric layer on the bottom electrode and a top electrode on the first dielectric layer, and the dummy capacitor element includes a dummy bottom electrode on the substrate and a second dielectric layer on the dummy bottom electrode and a dummy top electrode on the second dielectric layer. The dummy capacitor element is located so that a space between the top electrode and the dummy top electrode is in a predetermined range (e.g. 0.3 μm to 14 μm).

Two or more semiconductor elements can be included in the semiconductor device. In such a case, an embodiment of the semiconductor device of the present invention comprises a substrate, at least two capacitor elements, and a dummy capacitor element. Each capacitor element includes a bottom electrode, a first dielectric layer and a top electrode, and the dummy capacitor element includes a dummy bottom electrode, a second dielectric layer and a dummy top electrode as described above. The capacitor elements and the dummy capacitor element are located so that a space between an adjacent pair of electrodes selected from the top electrodes and the dummy top electrode, in which at least one electrode in the pair is one of the top electrodes, is in a predetermined range (e.g. 0.3 μm to 14 μm). The semiconductor device can include two or more dummy semiconductor devices.

Such a semiconductor device of the present invention can be manufactured by a method which comprises forming a dielectric film on a substrate, forming the electrically conductive film on the dielectric film, and etching the electrically conductive film so as to form the electrode. When etching the electrically conductive film, a dummy electrode is formed with the electrode so that a space between the electrode and the dummy electrode is in a predetermined range (e.g. 0.3 μm to 14 μm).

The inventors have succeeded in elucidating the degradation of the dielectric with high dielectric constant in a semiconductor element.

As shown in FIGS. 20A and 20B, the second metal film 204 is etched until the surface of the dielectric film 202 appears. As shown in FIG. 21, in the dry etching, etching ions 210 are partially accumulated on the dielectric film 203 so that the surface of the dielectric film 203 holds electrical charges 211. In the case of a dielectric with high dielectric constant, the amount of electrical charges 211 is around 100 times as much as that in the case of silicon oxide or silicon nitride. The amount of electrical charges is proportional to the area of the surface exposed to the etching ions 210.

Therefore, the large exposed surface of the dielectric film 203 with high dielectric constant causes an electrostatic repulsion between the etching ions 210 and the electrical charges 211. As shown in FIG. 21, the repulsion changes the direction of travel 212 of the etching ions 210 around the photoresist 209. The etching ions 210 deviate to the dielectric covered with the metal layer 207, which will remain as a dielectric layer of a capacitor element. More collision of etching ions 210 with the dielectric below the edge portion of the metal layer 207 than usual generates defects in the crystal structure in the dielectric. Thus, a damaged region 213, which causes the degradation in the capacitor element, is formed.

According to the present invention, the surface of the dielectric film exposed to the etching ions is limited by the dummy element, which can reduce the electrical charges on the dielectric film. Therefore, the collision with the etching ions proceeding diagonally is suppressed to prevent the semiconductor element from degrading in electrical characteristics.

BRIEF DESCRIPTION OF THE DRAWINGS

FIG. 3A shows a step of forming films and photoresist layers on a substrate. FIG. 3B shows a step of forming top electrodes by dry etching. FIG. 3C shows a step of forming other photoresist layers. FIG. 3D shows a step of forming dielectric layers and bottom electrodes.

FIG. 20A shows a step of forming films and a photoresist layer on a substrate. FIG. 20B shows a step of forming the electrodes and the capacitor insulating layers of the capacitor element by dry etching.

DESCRIPTION OF THE PREFERRED EMBODIMENTS

Figure 1:
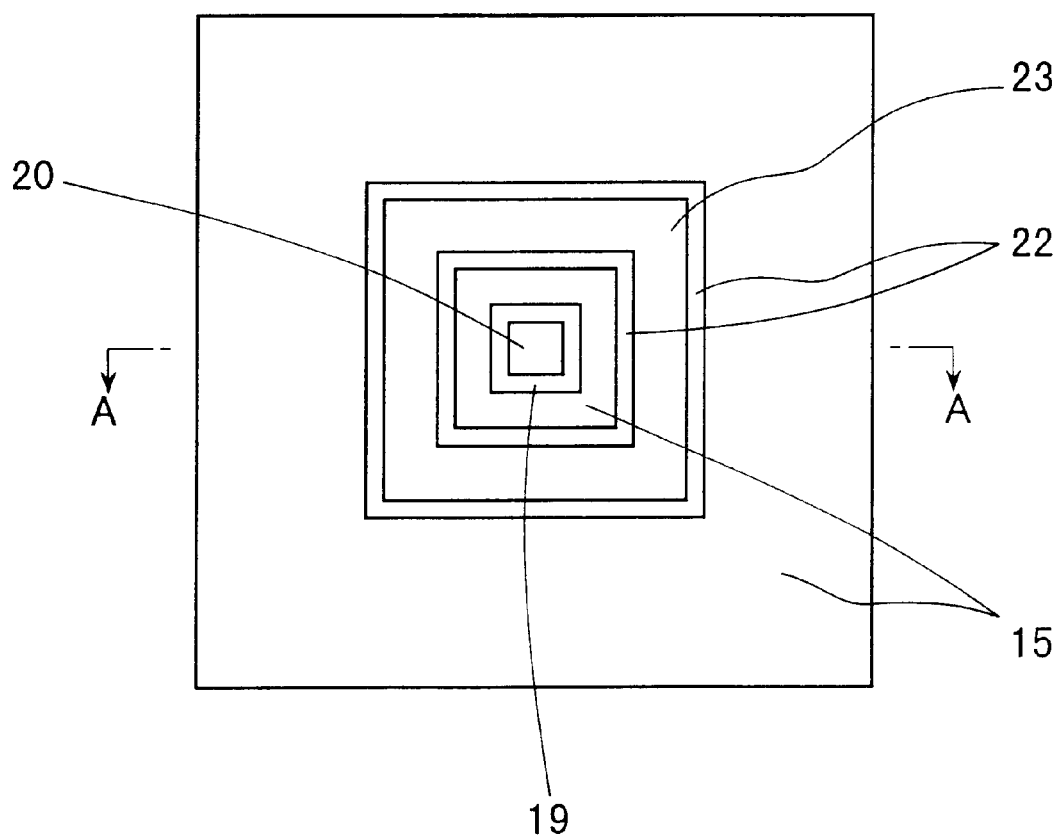
FIG. 1 is a plan view to show a semiconductor device of an embodiment of the present invention.

In the semiconductor device of the invention, the space between the electrode and the dummy electrode is preferably in the range of 0.3 μm to 9 μm, more preferably in the range of 0.3 μm to 5 μm.

In the semiconductor device of the invention, the electrode and the dummy electrode are preferably composed of the same electrically conductive material. The electrode and the dummy electrode are preferably formed by etching the same electrically conductive film.

In the semiconductor device of the invention, the first dielectric layer is composed of the material selected from a dielectric material having a dielectric constant of 100 or more and a ferroelectric material.

In the semiconductor device of the invention, the first dielectric layer and the second dielectric layer are composed of the same dielectric material. The first dielectric layer and the second dielectric layer are preferably included in the same dielectric film. The first dielectric layer and the second dielectric layer are preferably formed by etching the same dielectric film.

Some embodiments of the present invention are explained below referring to the drawings.

First embodiment

Figure 2:
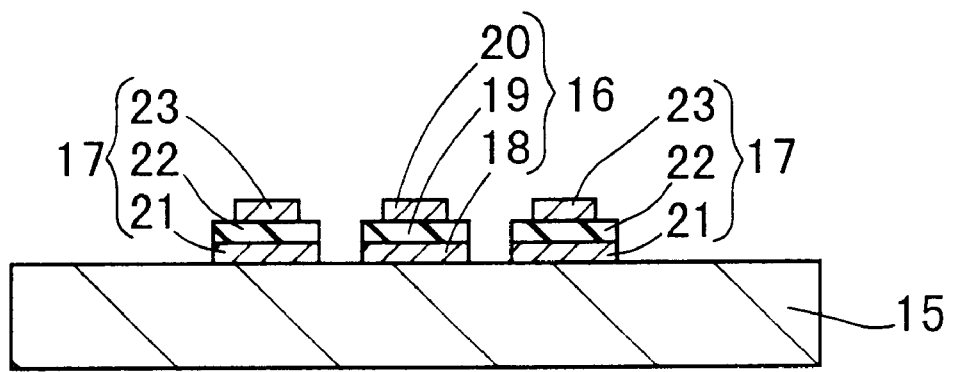
FIG. 2 is a cross sectional view taken on line A—A in FIG. 1.

As shown in FIGS. 1 and 2, in the semiconductor device, a capacitor element 16 formed on a substrate 15 is encircled by a dummy capacitor element 17. The capacitor element 16 has a rectangular shape while the dummy capacitor element 17 has a frame-shape surrounding the capacitor element 16 entirely. The capacitor element 16 is composed of a first (bottom) electrode 18, a capacitor dielectric layer 19 and a second (top) electrode 20. The dummy capacitor element 17 is composed of a first dummy (a dummy bottom) electrode 21, a dummy capacitor dielectric layer 22 and a second dummy (a dummy top) electrode 23. As shown in FIG. 2, in the capacitor element 16 and the dummy capacitor element 17, the corresponding layers have substantially the same thickness.

A method for manufacturing the semiconductor device is explained below referring to FIGS. 3A to 3D.

Figure 3A:
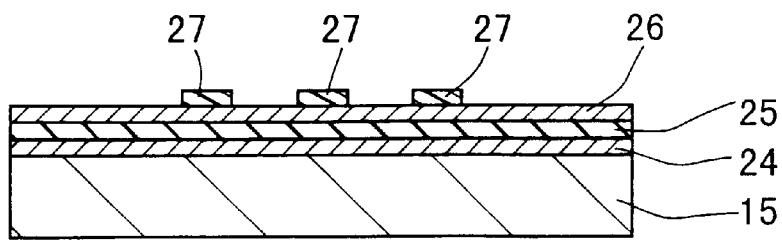
FIGS. 3A to 3D are cross sectional views to show a method for manufacturing a semiconductor device of an embodiment of the present invention.

As shown in FIG. 3A, a first metal film 24 is formed on the substrate 15 including an integrated circuit at a thickness of 50 nm to 400 nm. A dielectric film 25 with high dielectric constant composed of e.g. SrBixTaxOy is formed on the first metal film 24 by spin coating or CVD. A second metal film 26 is formed on the dielectric film 25 at a thickness of 50 nm to 300 nm. The first and second metal films 24 and 26 can be composed of platinum and formed by sputtering. On the second metal film 26, first photoresist layers 27 are formed in a predetermined pattern by photolithography.

Figure 3B:
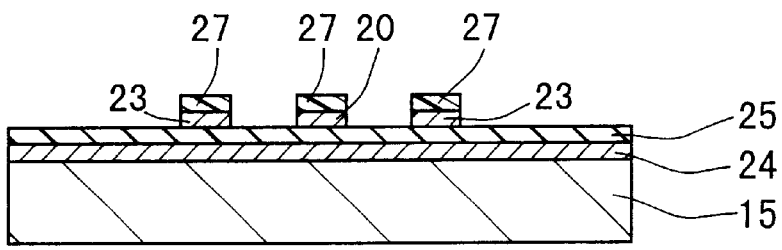

Next, as shown in FIG. 3B, the second metal film 26 is removed selectively by dry etching to form the second electrode 20 and the second dummy electrode 23.

Figure 3C:
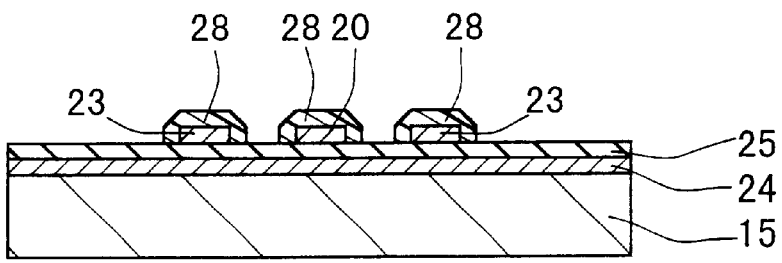
Figure 3D:
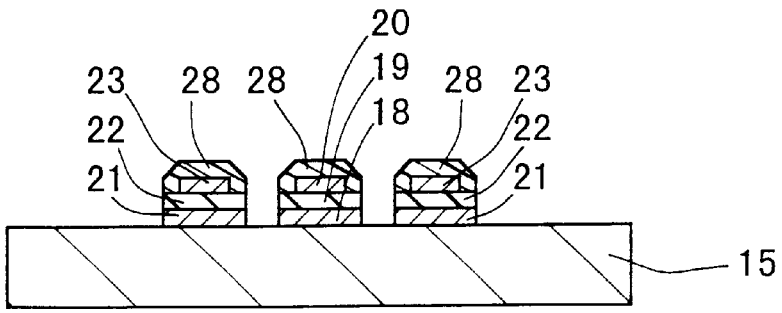

After second photoresist layers 28 are formed in another predetermined pattern by photolithography as shown in FIG. 3C, the dielectric film 25 and the first metal film 24 are removed selectively by dry etching. As a result, a capacitor dielectric layer 19, a first electrode 18, a dummy capacitor dielectric layer 22 and a first dummy electrode 21 are formed as shown in FIG. 3D.

Thus, the capacitor element 16 and the dummy capacitor element 17 are formed at the same time. In the semiconductor device, the space between the second electrode 20 and the second dummy electrode 23 is set in the range of 0.3 μm to 14 μm.

Figure 4:
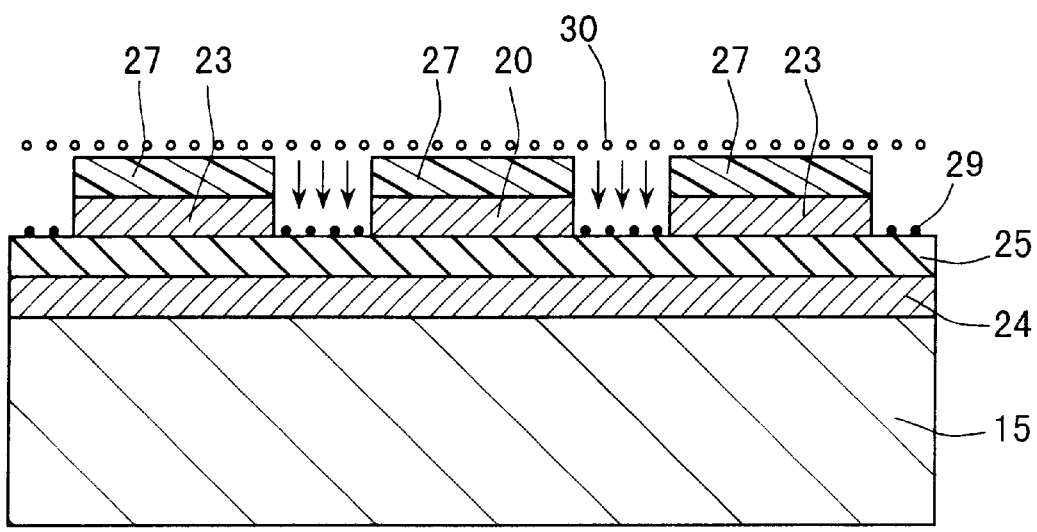
FIG. 4 is a cross sectional view to show a step of forming top electrodes by dry etching with etching ions.
Figure 21:
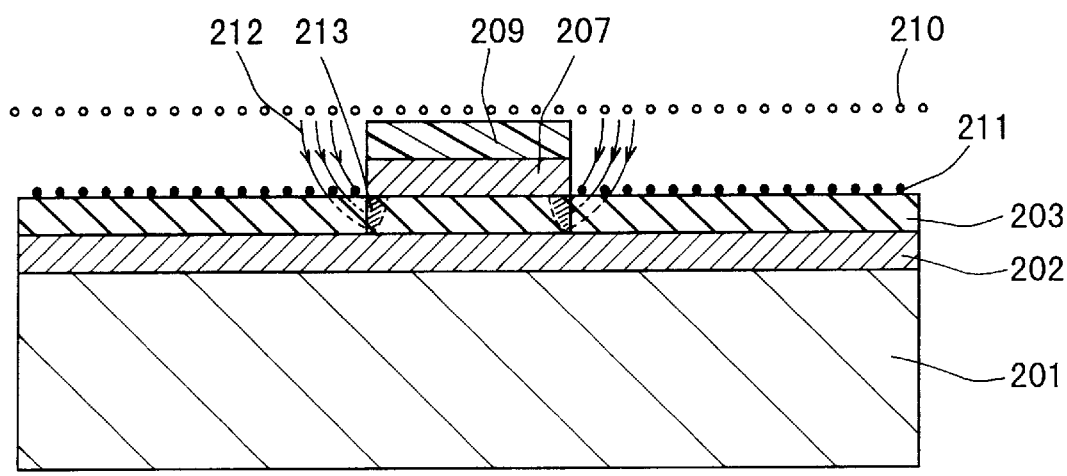
FIG. 21 is a cross sectional view to show a step of forming top electrodes by dry etching with etching ions in the conventional method.

As shown in FIG. 4, in the step of etching the second metal film 26 to reveal the surface of the dielectric film 25, the surface of the dielectric film 25 surrounding the second electrode 20 is limited by the second dummy electrode 23. As a result, the amount of electrical charges 29 accumulated on the surface is less than that in the conventional method as shown in FIG. 21 so that the electrostatic repulsion to etching ions 30 is reduced. Thus, the etching ions 30 can proceed to the dielectric film 25 without deviating in path. Therefore, the collision of the etching ions travelling diagonally with the dielectric below the second electrode 20 can be suppressed.

Second embodiment

Figure 5:
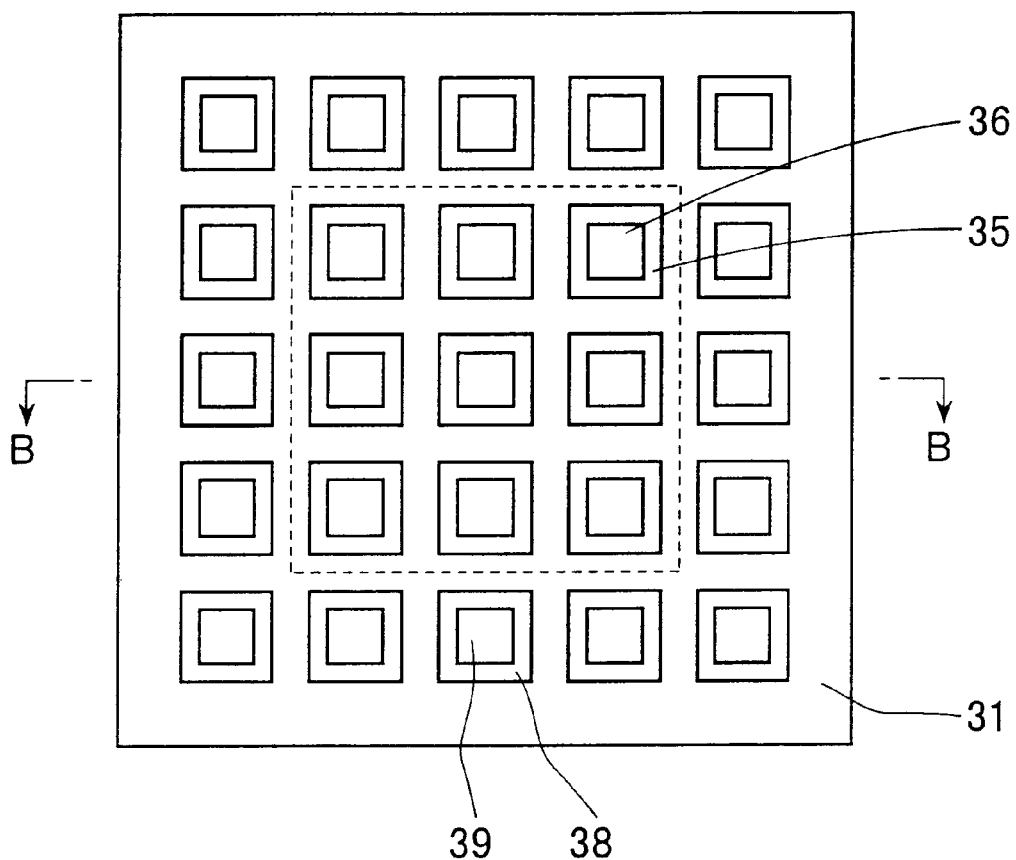
FIG. 5 is a plan view to show a semiconductor device of another embodiment of the present invention.
Figure 6:
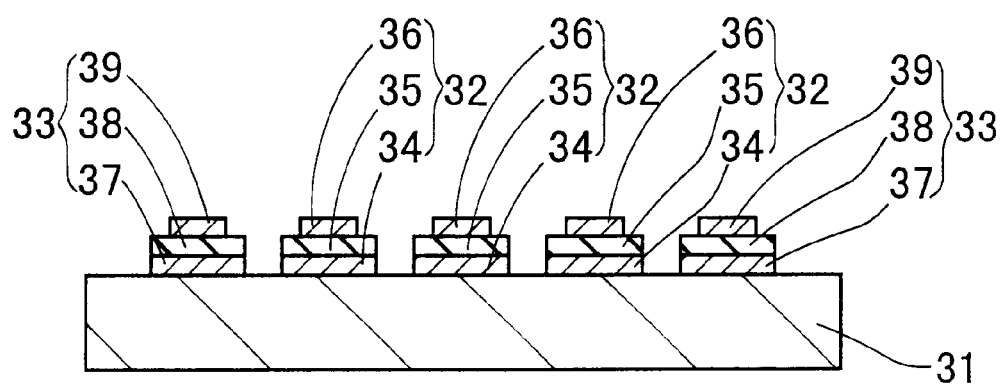
FIG. 6 is a cross sectional view taken on line B—B in FIG. 5.

As shown in FIGS. 5 and 6, in the semiconductor device, capacitor elements 32 and dummy capacitor elements 33 are arranged regularly on a substrate 31 including an integrated circuit. The capacitor elements 32 are arranged in the inner area of a broken line in FIG. 5 while the dummy capacitor elements 33 are located to surround the capacitor elements 32. The capacitor elements 32 and the dummy capacitor elements 33 have the same rectangular shape. Each capacitor element 32 is composed of a first electrode 34, a capacitor dielectric layer 35 and a second electrode 36. Each dummy capacitor element 33 is composed of a first dummy electrode 37, a dummy capacitor dielectric layer 38 and a second dummy electrode 39. As shown in FIG. 6, in the capacitor element 32 and the dummy capacitor element 33, the corresponding layers have substantially the same thickness.

The semiconductor device can be produced by the same method as described above except for a pattern of the photoresist layers. The suitable materials for the layers also are the same as the first embodiment.

In the semiconductor device, each second electrode 36 is surrounded by four electrodes. The four electrodes are selected from the other second electrodes 36 and the dummy electrodes 39. The space between the second electrode 26 and the electrodes adjacent to the second electrode is set in the range of 0.3 $\mu$m to 14 $\mu$m.

Such an arrangement also can suppress the damage to the capacitor dielectric layer 35. In addition, the dummy capacitor elements 33 can reduce the difference in electrical characteristics among the capacitor elements 32, especially the difference between the outer elements and the inner elements.

The dummy capacitor element may have another shape such as a frame-like shape as described in the first embodiment.

Third embodiment

Figure 7:
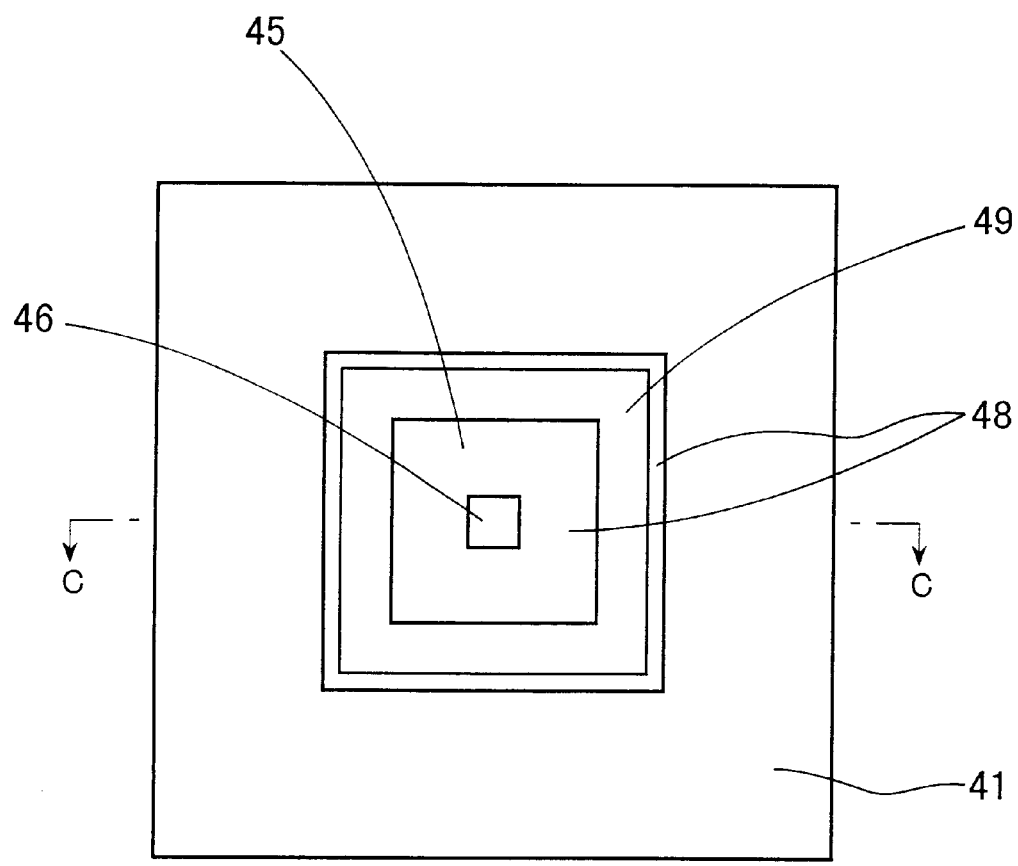
FIG. 7 is a plan view to show a semiconductor device of still another embodiment of the present invention.
Figure 8:
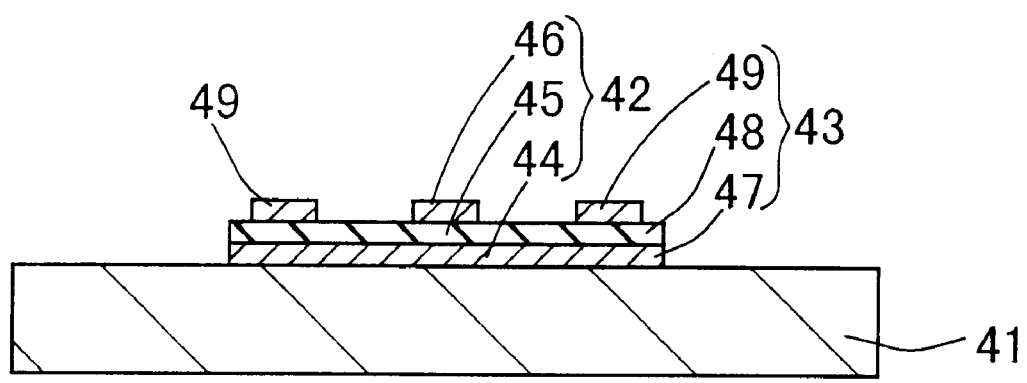
FIG. 8 is a cross sectional view taken on line C—C in FIG. 7.

As shown in FIGS. 7 and 8, in the semiconductor device, a capacitor element 42 formed on a substrate 41 including an integrated circuit is encircled by a dummy capacitor element 43. The capacitor element 42 composed of a first electrode 44, a capacitor dielectric layer 45 and a second electrode 46. The dummy capacitor element 43 is composed of a first dummy electrode 47, a dummy capacitor dielectric layer 48 and a second dummy electrode 49. As shown in FIG. 8, the first electrode 44 and the first dummy electrode 47 are included in the same electrically conductive film. The capacitor dielectric layer 45 and the dummy capacitor layer 48 also are included in the same dielectric film.

The semiconductor device can be produced by the same method as described above except for a pattern of the photoresist layers. The suitable materials for the layers also are the same as the first embodiment. The space between the second electrode 46 and the dummy electrode 49 is set in the range of 0.3 $\mu$m to 14 $\mu$m.

Such an arrangement also can suppress the damage of the capacitor dielectric layer 45.

The semiconductor device described above or in the first embodiment may include two or more capacitor elements.

Fourth embodiment

Figure 9:
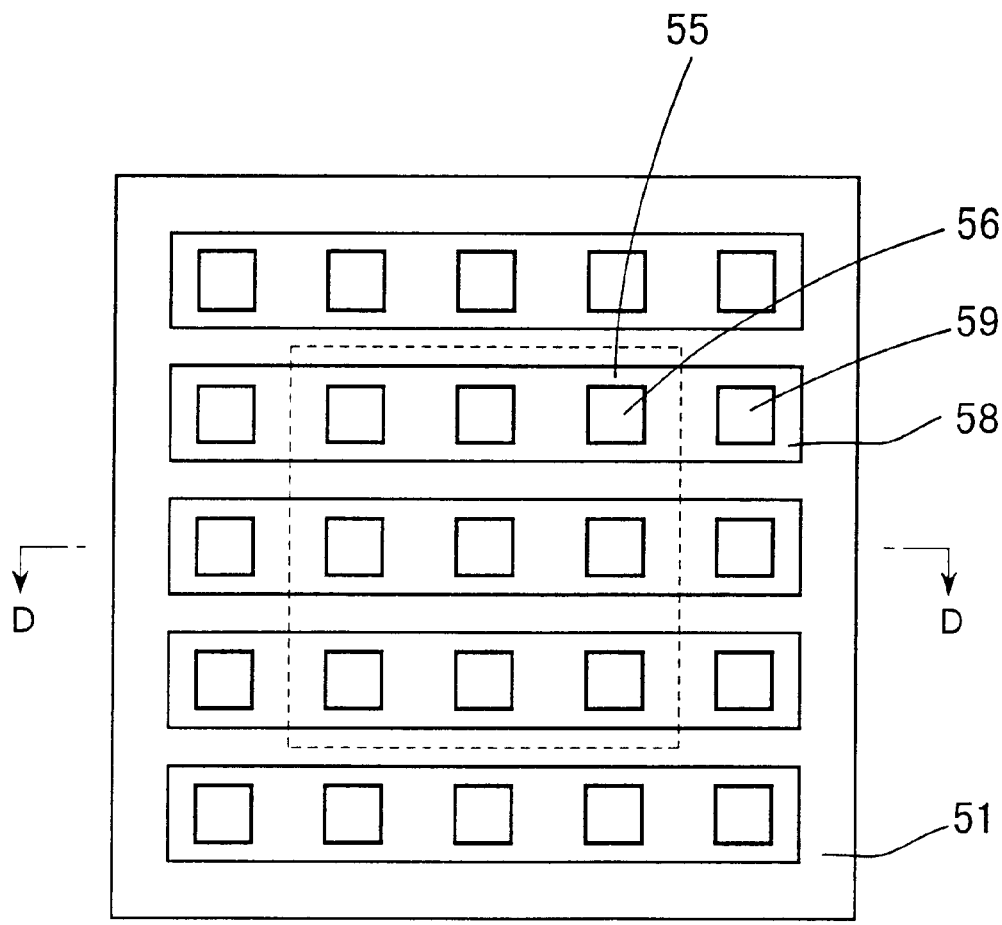
FIG. 9 is a plan view to show a semiconductor device of yet another embodiment of the present invention.
Figure 10:
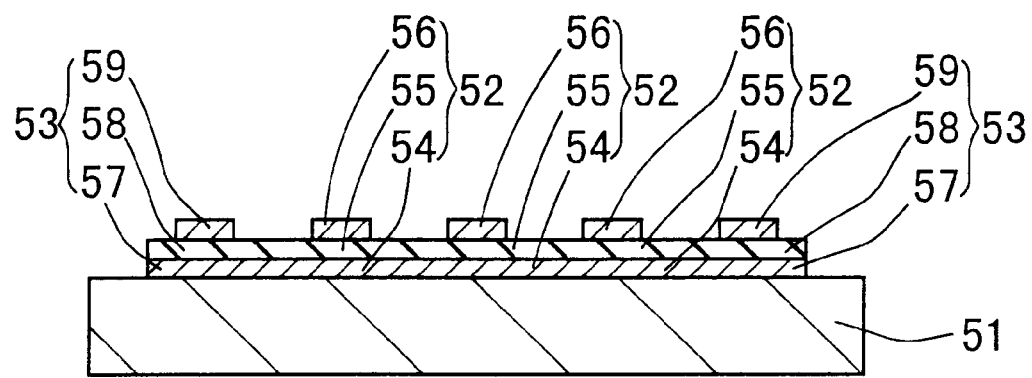
FIG. 10 is a cross sectional view taken on line D—D in FIG. 9.

As shown in FIGS. 9 and 10, in the semiconductor device, capacitor elements 52 and dummy capacitor elements 53 are arranged regularly on a substrate 51 including an integrated circuit. The capacitor elements 52 are arranged in the inner area of a broken line in FIG. 9 while the dummy capacitor elements 53 are located to surround the capacitor elements 52. Each capacitor element 52 is composed of a first electrode 54, a capacitor dielectric layer 55 and a second electrode 56. Each dummy capacitor element 53 is composed of a first dummy electrode 57, a dummy capacitor dielectric layer 58 and a second dummy electrode 59.

As shown in FIGS. 9 and 10, the first electrode 54 and the first dummy electrode 57 arranged in a line are included in the same electrically conductive film. The capacitor dielectric layer 55 and the dummy capacitor layer 58 in the line also are included in the same dielectric film. In the semiconductor device, lines including the capacitor elements 52 and the dummy capacitor elements 53 at both ends are arranged, except for the lines at both ends. The lines at both ends includes only the dummy capacitor elements 53.

The semiconductor device can be produced by the same method as described above except for a pattern of the photoresist layers. The suitable materials for the layers also are the same as the first embodiment.

As described in the second embodiment, the space between the second electrode 56 and the electrodes adjacent to the second electrode 56 is set in the range of 0.3 $\mu$m to 14 $\mu$m.

Such an arrangement also can suppress the damage to the capacitor dielectric layer 55 and reduce the difference in electrical characteristics among the capacitor elements 52. In addition, the semiconductor device has less undulations since some of the films remains without etching. Less undulations make wiring to the integrated circuit easier.

In the embodiments as described above, the electrode and the dummy electrode corresponding to the electrode are composed of the same material. The capacitor dielectric element and the dummy dielectric layer also are composed of the same material. The capacitor element is integrated into the circuit in the semiconductor device while the dummy capacitor element is produced not for being integrated into the circuit but for suppressing the collision of the etching ions with the dielectric in the capacitor element. As long as the desired object can be achieved, the shape, the material and the arrangement of the dummy element are not limited.

For example, electrically conductive oxides such as $RuO_2$ and $IrO_2$ can be used as a material for the electrode as well as various kinds of metal. Dielectric compounds such as $Ba_xSr_{1-x}TiO_x$, $Pb(Zr_{1-x}Ti_x)O_3$, $SrBi_2(Ta_{1-x}Nb_x)_2O_9$, $Bi_4Ti_3O_{12}$ ($0 \leq x \leq 1$) can be used for the dielectric capacitor layer.

Fifth embodiment

Other semiconductor elements such as transistors also can be used for the semiconductor element of the present invention as well as capacitor elements.

Figure 11:
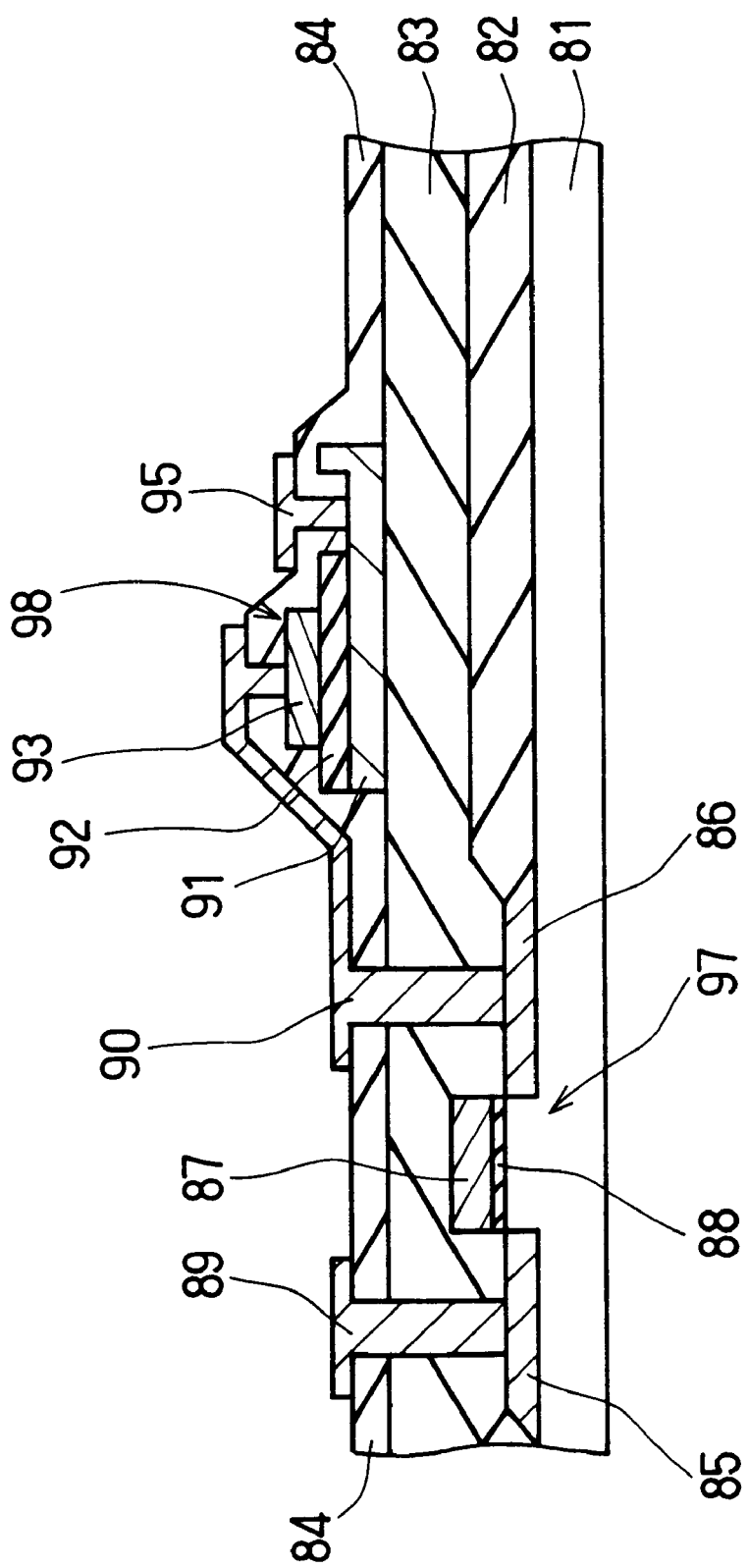
FIG. 11 is a cross sectional view to show a memory cell as an embodiment of the semiconductor device of the present invention.

FIG. 11 shows an embodiment of a memory cell including a transistor 97 and a capacitor element 98. In such a memory cell, the dummy elements as described above can be used for transistors and capacitor elements.

Figure 13:
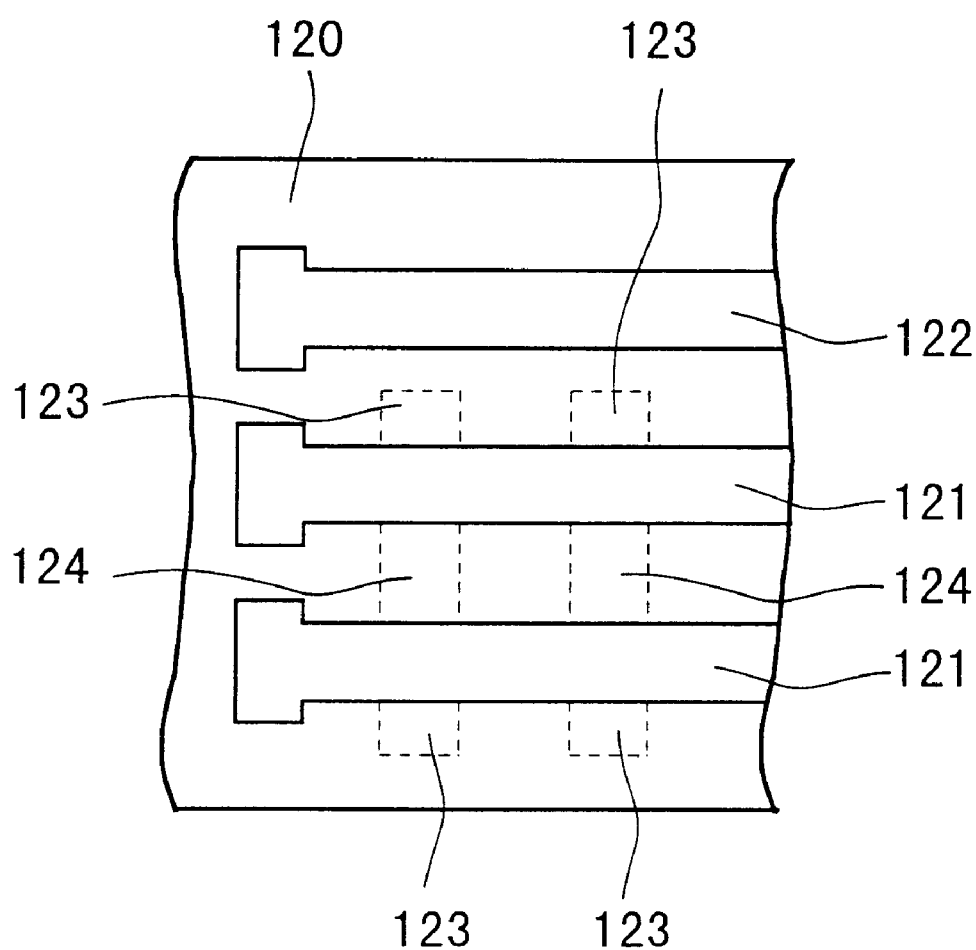
FIG. 13 is a plan view to show a semiconductor device including a transistor of an embodiment of the present invention.

For example, in the case of a transistor, a gate electrode 121 on a substrate 120 corresponds to the top electrode in a capacitor element as shown in FIG. 13. A gate insulating layer (not shown in FIG. 13) corresponding to a capacitor dielectric layer in a capacitor element is formed between the substrate 120 and the gate electrode 121. When forming a transistor, a dummy gate electrode 122 can suppress the degradation of the transistor as is in the case of a capacitor element. As shown in FIG. 13, a source electrode 123 and a drain electrode 124 formed in the substrate 120 is not necessary below the dummy gate electrode 122.

In the memory cell in FIG. 11, a transistor 97 includes a gate 87, a source 85, a drain 86 and a gate insulating layer 88 composed of a ferroelectric material. The memory cell also has a capacitor element 98 including a bottom electrode 91, a capacitor insulating layer 92 composed of a ferroelectric material and a top electrode 93.

The transistor 97 and the capacitor element 98 are connected with other elements by bit lines 89, 90 and 95. A field oxide layer 82 and insulating layers 83 and 84 formed on a substrate 81 prevent unnecessary contacts between the elements.

Figure 12:
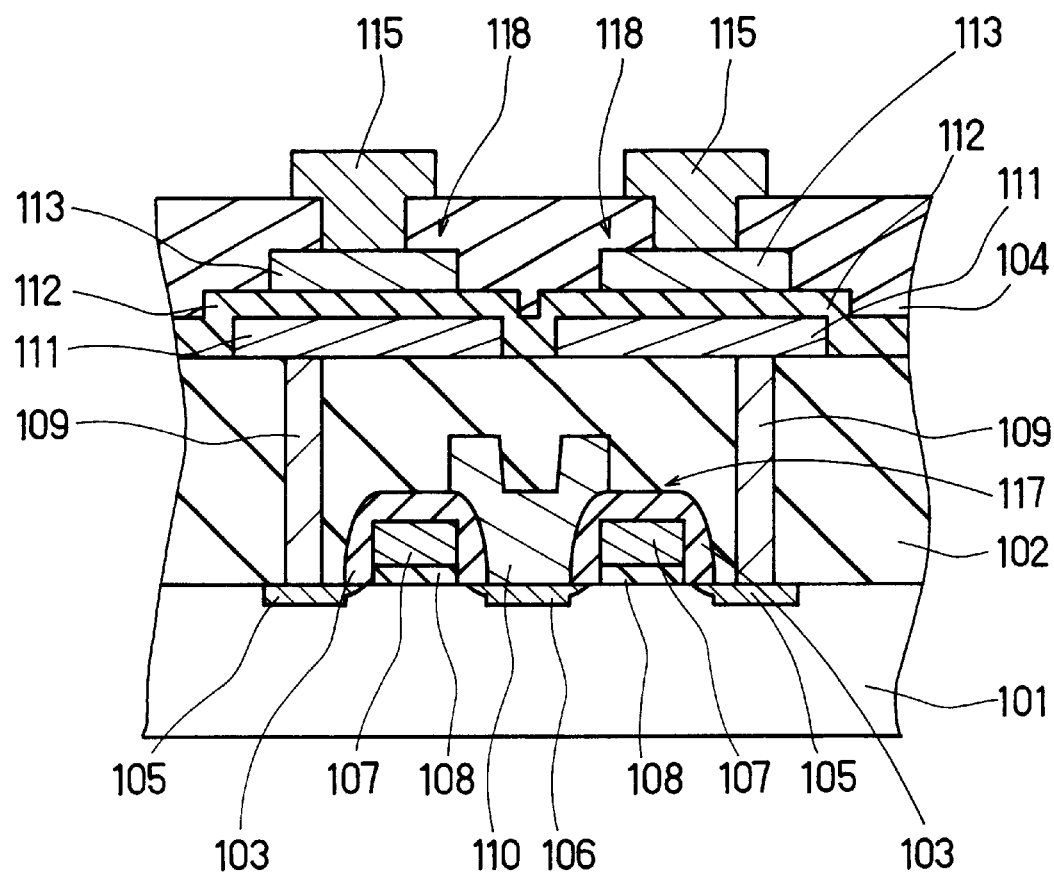
FIG. 12 is a cross sectional view to show another memory cell as an embodiment of the semiconductor device of the preset invention.

A memory cell in FIG. 12 also has transistors 117 including gates 107, sources 105, drains 106, gate insulators 103 and gate insulating layers 108 composed of a ferroelectric material. On an insulating layer 102, there are capacitor elements 118 including bottom electrodes 111, capacitor insulating layers 112 composed of a ferroelectric material and top electrodes 113.

The transistor 117 and the capacitor element 118 also are connected with each other and other elements by bit lines 109, 110 and 115. Insulating layers 102 and 104 prevent unnecessary contacts between the elements. In the memory cells as shown in FIGS. 11 and 12, dummy capacitor elements and/or dummy transistors (dummy gate electrodes) can be used for preventing degradation of the layer composed of the dielectric with high dielectric constant.

The semiconductor device for which the dummy element can be used is not limited to the memory cells as described above.

EXAMPLE

Figure 14:
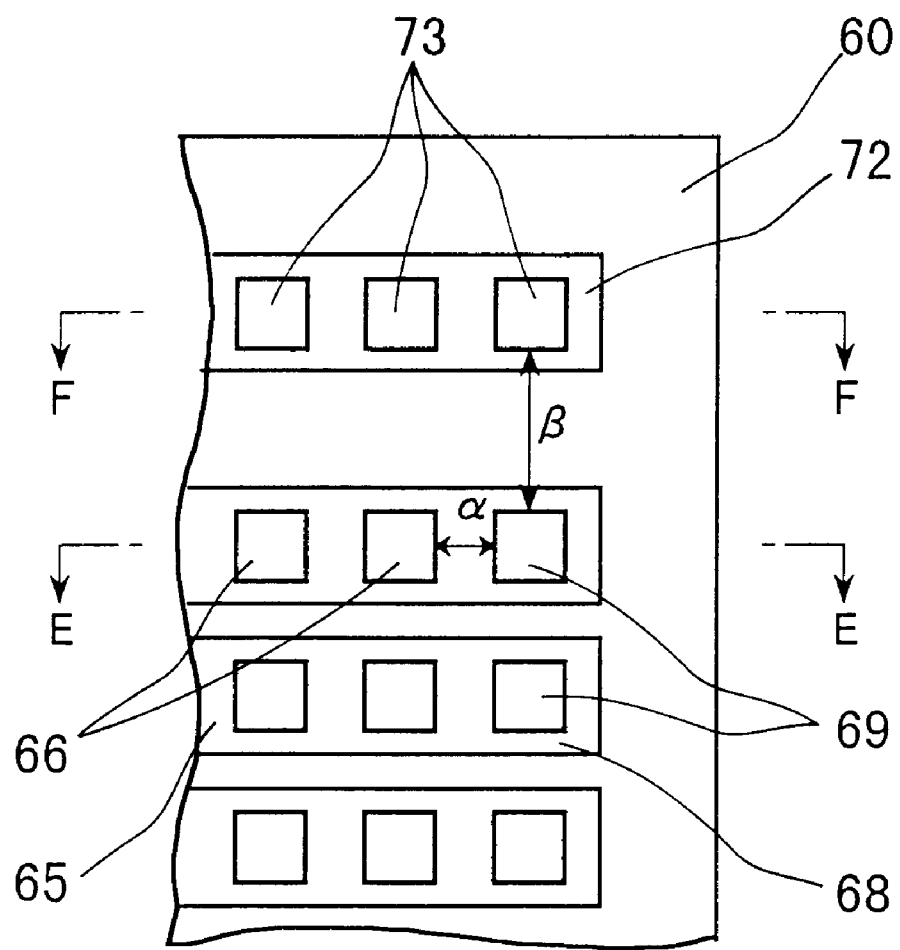
FIG. 14 is a partial plan view to show a semiconductor device produced in the example.
Figure 15:
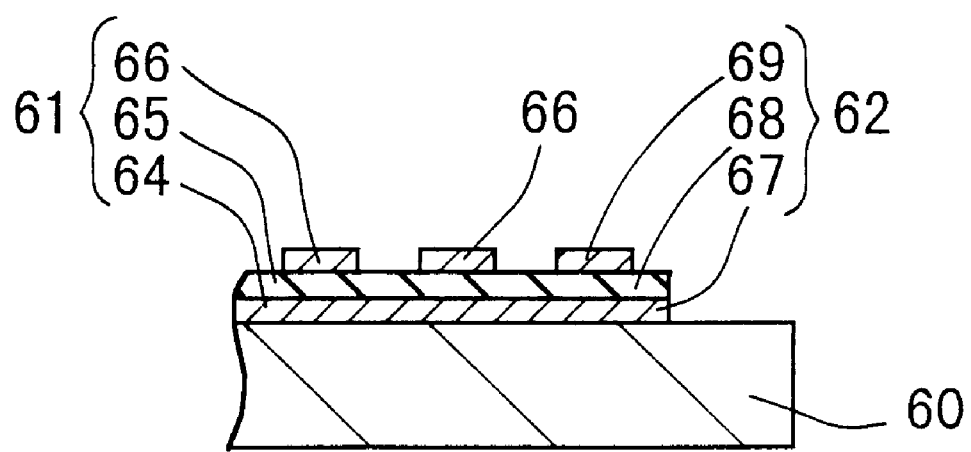
FIG. 15 is a cross sectional view taken on line E—E in FIG. 14.
Figure 16:
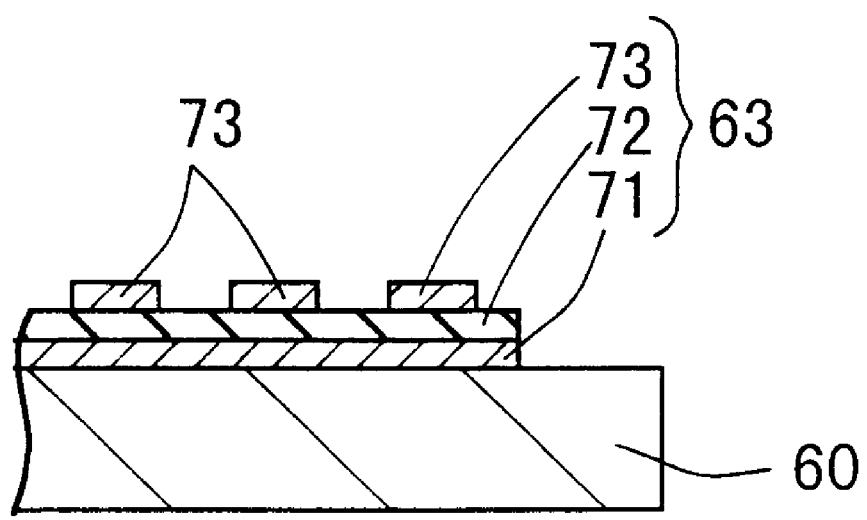
FIG. 16 is a cross sectional view taken on line F—F in FIG. 14.

The devices as shown in FIGS. 14 to 16 were produced. In the semiconductor device, capacitor elements 61, first dummy capacitor elements 62 and second dummy capacitor elements 63 were arranged on a substrate 60.

As shown in FIGS. 14 and 15, in the capacitor elements 61 and the first dummy capacitor elements 62, a first electrode 64 and a first dummy electrode 67 are included in the same electrically conductive film. A capacitor dielectric layer 65 and a dummy capacitor dielectric layer 68 also are included in the same dielectric film. As shown in FIG. 15, the first dummy capacitor elements 62 are located at the end of the line including the capacitor elements 61 and the first dummy capacitor elements 62.

As shown in FIGS. 14 and 16, only the second dummy capacitor elements 63 are provided at the line at the end. In the second dummy capacitor elements 63, first dummy electrodes 71 are included in the same electrically conductive film and dummy dielectric capacitor layers 72 are included in the same dielectric film.

The space α between a second electrode 66 and a second dummy electrode 69 in the first dummy capacitor element 62 was set at 1.5 μm. The space β between the second electrode 66 and a second dummy electrode 73 in the second dummy capacitor element 63 was set at 12.8 μm. The devices were produced by the process as described above. The capacitor dielectric layer was composed of SrBixTaxOy at a thickness of 0.24 μm. The electrodes were composed of Pt.

On the other hand, semiconductor devices were produced in the same way but without the first dummy elements 62 and the second dummy elements 63. Remnant polarization in each device was measured.

Figure 17:
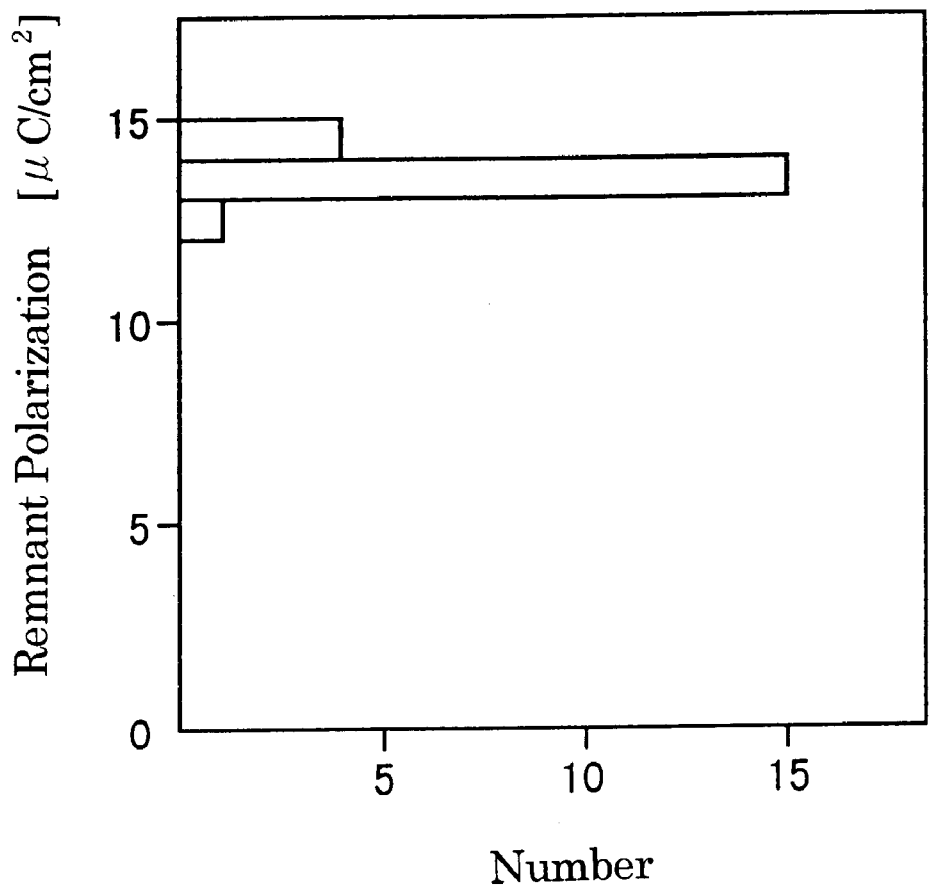
FIG. 17 is a graph to show a distribution of remnant polarization in capacitor elements with dummy elements.
Figure 18:
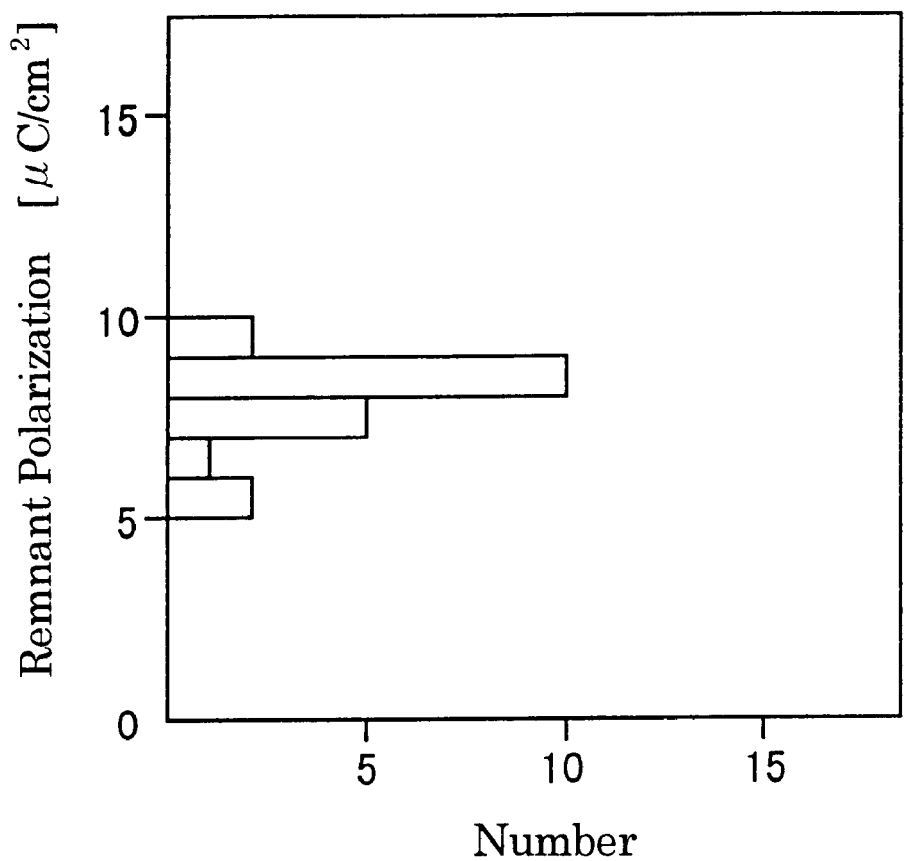
FIG. 18 is a graph to show a distribution of remnant polarization in capacitor elements without dummy elements.

As shown in FIG. 17, remnant polarization in the devices with the dummy elements was 13 μC/cm² to 15 μC/cm². As shown in FIG. 18, remnant polarization in the devices without the dummy elements was 5 μC/cm² to 10 μC/cm². Thus, the dummy elements can improve and stabilize remnant polarization in the capacitor elements. Therefore, for example, the dummy elements can expand a margin for error in reading data from the device.

Figure 19:
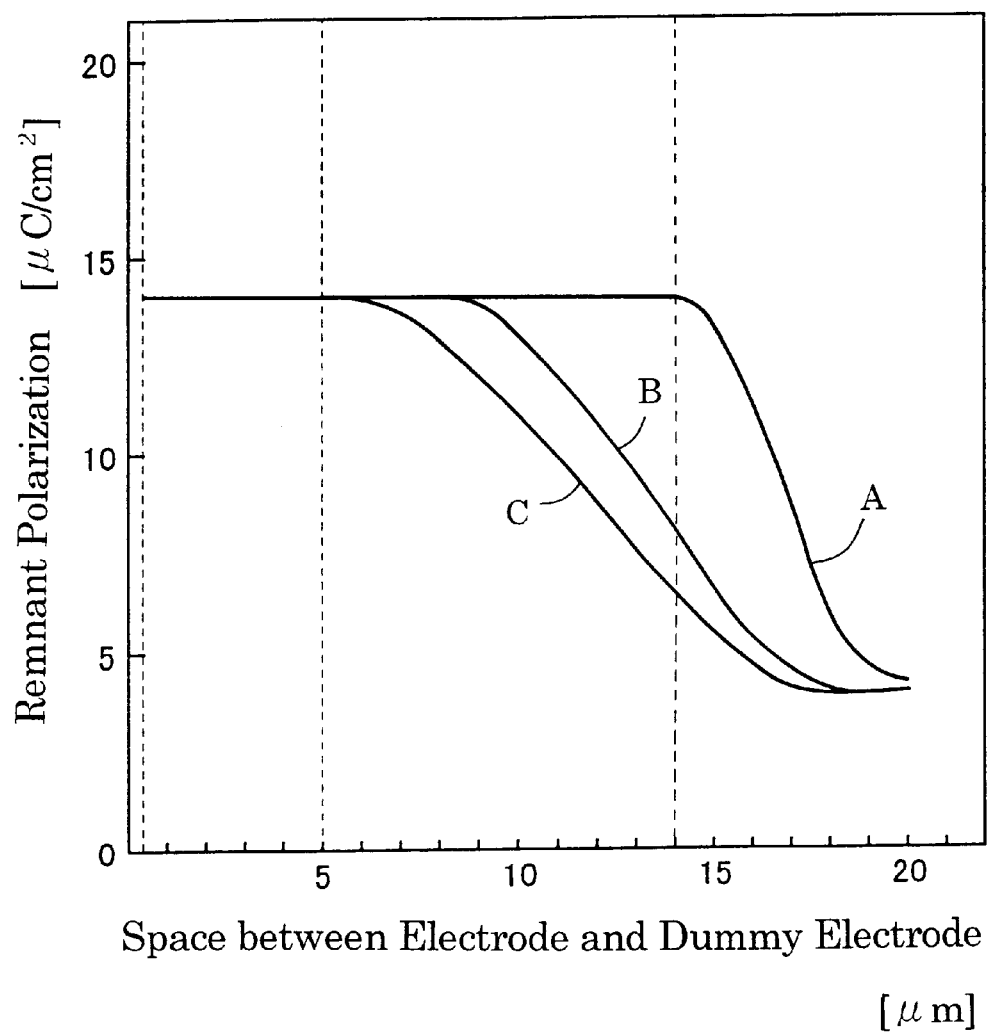
FIG. 19 is a graph to show a remnant polarization with respect to the space of the top electrode in a capacitor element and the dummy top electrode in a dummy capacitor element.
Figure 20A:
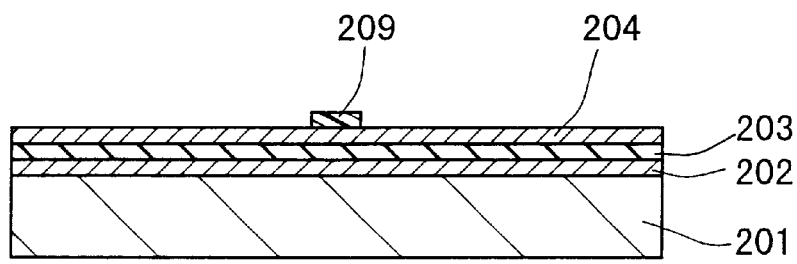
FIGS. 20A and 20B are cross sectional views to show a conventional method for manufacturing a semiconductor device.
Figure 20B:
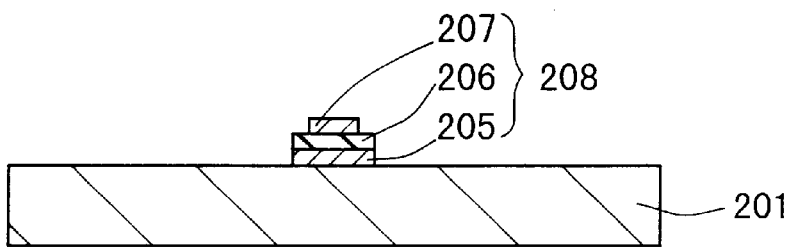

The relationship between the space β and the remnant polarization was investigated. As shown in FIG. 19, when the space β was above 14 μm, the remnant polarization sharply dropped (line A). In this case, the size of the second electrodes 66 and the second dummy electrodes 69 and 73 were 5×5 μm. When the size of the electrodes was set at 1.5×1.5 μm, the remnant polarization sharply dropped in the range above 9 μm. When the size of the electrodes was set at 1×1 μm, the remnant polarization sharply dropped in the range above 5 μm. The space β below 0.3 μm makes it difficult to produce the elements. The same results were observed when the space α was changed instead of the space β.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device comprising:
   a substrate,
   a semiconductor element on the substrate, the semiconductor element including a first dielectric layer and an electrode on the first dielectric layer, and
   a dummy semiconductor element on the substrate, the dummy semiconductor element including a second dielectric layer and a dummy electrode on the second dielectric layer,
   wherein the dummy semiconductor element is located so that a space between the electrode and the dummy electrode is in a predetermined range, and the semiconductor device is a transistor in which the electrode works as a gate electrode of the transistor; and said first dielectric layer is composed of the material selected from a dielectric material having a dielectric constant of 100 or more and a ferroelectric material.

2. A semiconductor device according to claim 1, wherein the predetermined range of the space is between 0.3 μm and 14 μm.

3. A semiconductor device according to claim 1, wherein the electrode and the dummy electrode are composed of the same electrically conductive material.

4. A semiconductor device according to claim 1, wherein the first dielectric layer and the second dielectric layer are composed of the same dielectric material.

5. A semiconductor device according to claim 1, wherein the electrode is surrounded by the dummy electrode.

* * * * *